US012610602B2

(12) United States Patent
Hsu

(10) Patent No.: US 12,610,602 B2
(45) Date of Patent: Apr. 21, 2026

(54) SEMICONDUCTOR DEVICE AND MANUFACTURE METHOD

(71) Applicant: NANYA TECHNOLOGY CORPORATION, New Taipei City (TW)

(72) Inventor: Feng Wen Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 491 days.

(21) Appl. No.: 18/162,685

(22) Filed: Jan. 31, 2023

(65) Prior Publication Data

US 2024/0258392 A1 Aug. 1, 2024

(51) Int. Cl.
*H10D 64/27* (2025.01)
*H10D 64/01* (2025.01)
*H10D 64/68* (2025.01)

(52) U.S. Cl.
CPC ........... *H10D 64/513* (2025.01); *H10D 64/01* (2025.01); *H10D 64/683* (2025.01)

(58) Field of Classification Search
None
See application file for complete search history.

(56) References Cited

U.S. PATENT DOCUMENTS

2014/0264874 A1* 9/2014 Sung ................. H01L 21/76832
257/751
2021/0066466 A1* 3/2021 Kwon .................. H10D 64/687

FOREIGN PATENT DOCUMENTS

TW I786692 B 12/2022

* cited by examiner

*Primary Examiner* — Alexander G Ghyka
(74) *Attorney, Agent, or Firm* — CKC & Partners Co., LLC

(57) ABSTRACT

A semiconductor device includes a patterned substrate, a first barrier layer, a second barrier layer and a conductive layer. The patterned substrate has a trench and a sidewall surrounding the trench. The first barrier layer disposed on a first portion of the sidewall. The second barrier layer with a permittivity from 0.5 to 3.8 is disposed on the first barrier layer and a second portion of the sidewall, in which the second portion of the sidewall is higher than the first portion of the sidewall and neighboring to a top surface of the patterned substrate. A conductive layer fills the trench. A method of manufacturing a semiconductor device is further provided.

10 Claims, 11 Drawing Sheets

110

SEMICONDUCTOR DEVICE AND MANUFACTURE METHOD

BACKGROUND

Field of Invention

The present disclosure relates to a semiconductor device.

Description of Related Art

An issue of gate induced drain leakage (GIDL) exists while a conductive layer (e.g., gate electrode) overlaps with impurity regions (e.g., source/drain regions). The increased GIDL is not desired because it reduces the reliability of the semiconductor device.

For the foregoing reason, there is a need to solve the above-mentioned problem by providing a semiconductor device with reduced GIDL.

SUMMARY

Some embodiments of the present disclosure provide a semiconductor device including a patterned substrate, a first barrier layer, a second barrier layer and a conductive layer. The patterned substrate has a trench and a sidewall surrounding the trench. The first barrier layer disposed on a first portion of the sidewall. The second barrier layer with a permittivity from 0.5 to 3.8 is disposed on the first barrier layer and a second portion of the sidewall, in which the second portion of the sidewall is higher than the first portion of the sidewall and neighboring to a top surface of the patterned substrate. A conductive layer fills the trench.

In the foregoing, the patterned substrate includes a raw region and a source/drain region over the raw region, in which the trench extends from the source/drain region to the raw region.

In the foregoing, the first barrier layer is directly disposed on the first portion of the sidewall.

In the foregoing, the first barrier layer includes a profile with an U-shaped cross-section in the trench.

In the foregoing, a permittivity of the first barrier layer is higher than a permittivity of the second barrier layer.

In the foregoing, the second barrier layer is directly disposed on the second portion of the sidewall.

In the foregoing, a top surface of the second barrier layer is coplanar with or lower than the top surface of the patterned substrate.

In the foregoing, the conductive layer is disposed on the first barrier layer and an overlapping region of the first barrier layer and the second barrier layer.

In the foregoing, a top surface of the conductive layer is coplanar with or lower than a top surface of the overlapping region.

In the foregoing, a top surface of the conductive layer is higher than a lower surface of the overlapping region In the foregoing, the patterned substrate includes a raw region and a source/drain region over the raw region, in which the trench extends from the source/drain region to the raw region.

In the foregoing, the semiconductor further includes a first contact and a second contact disposed on the patterned substrate, in which a lower surface of the first contact is higher than a lower surface of the second contact.

In the foregoing, the second contact directly contacts with the first barrier layer and the second barrier layer.

Some embodiments of the present disclosure provide a method of manufacturing a semiconductor device including: providing a patterned substrate having a trench and a sidewall surrounding the trench; disposing a first barrier material on a first portion of the sidewall to form a first barrier layer; filling a portion of the trench with a first conductive material to form a conductive portion, in which a top surface of the conductive portion is lower than a top surface of the first barrier layer; disposing a second barrier material with a permittivity from 0.5 to 3.8 on the first barrier layer and a second portion of the sidewall to form a second barrier layer, in which the second portion of the sidewall is higher than the first portion of the sidewall and neighboring to a top surface of the patterned substrate; and filling the trench with a second conductive material to form a conductive layer including the conductive portion.

In the foregoing, disposing a first barrier material on a first portion of the sidewall includes: disposing the first barrier material on the patterned substrate; and removing the first barrier material on the top surface of the patterned substrate.

In the foregoing, filling the portion of the trench with the first conductive material to form the conductive portion includes: filling up the trench with the first conductive material; and removing the first conductive material, in which a top surface of the first conductive material is lower than the top surface of the first barrier layer.

In the foregoing, disposing the second barrier material with the permittivity from 0.5 to 3.8 on the first barrier layer and the second portion of the sidewall includes: disposing the second barrier material on the top surface of the patterned substrate, the second portion of the sidewall, the first barrier layer and the top surface of the conductive portion; and removing the second barrier material on the top surface of the patterned substrate and the top surface of the conductive portion to form the second barrier layer and expose the conductive portion.

In the foregoing, removing the second barrier material on the top surface of the patterned substrate and the top surface of the conductive portion includes removing the second barrier material with a dry etchant including $CF_4$, $C_2F_6$, $C_3F_8$, $C_4F_8$, $F_2$, $NF_3$, $SF_6$, $CHF_3$, HF, $COF_2$, $ClF_3$, $H_2O_2$, or a combination thereof.

In the foregoing, filling the trench with the second conductive material includes: filling up the trench with the second conductive material; and removing the second conductive material, in which a top surface of the second conductive material is coplanar with or lower than a top surface of an overlapping region of the first barrier layer and the second barrier layer.

In the foregoing, the method further includes: removing a portion of patterned substrate; and disposing a first contact and a second contact disposed on the patterned substrate, in which a lower surface of the first contact is higher than a lower surface of the second contact.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
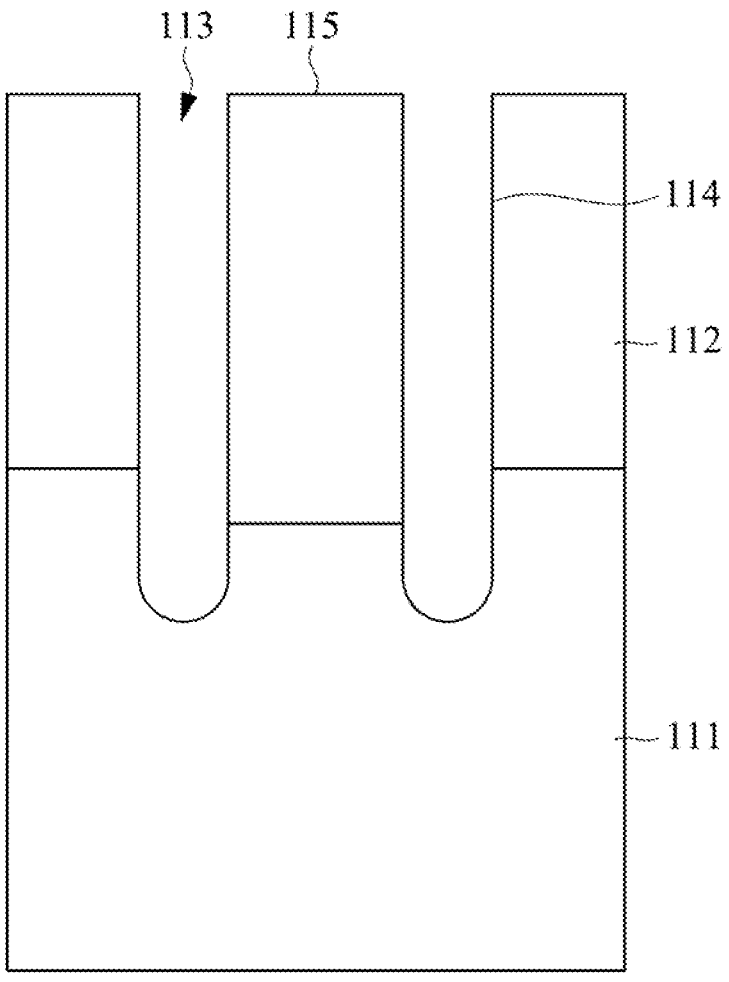
FIGS. 1-6, FIG. 7A and FIGS. 8-10 are cross-sectional views of various intermediary stages in the manufacturing of a semiconductor device in accordance with some embodiments of this disclosure.

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. Single forms used in the present specification such as "a", "one" and "the" includes multiple forms such as "at least one"; "or" represents "and/or" unless described clearly. As used herein, the term "and/or" includes any and all combinations of one or more of the associated listed items. It will be further understood that the terms "comprises", "comprising", and/or "has", "have", "having" when used in this specification, specify the presence of stated features, areas, integers, steps, operations, elements, and/or components, but do not preclude the presence or addition of one or more other features, areas, integers, steps, operations, elements, components, and/or groups thereof. As used herein, the term "permittivity" refers to "relative permittivity."

Embodiments of the present disclosure are described herein with reference to top illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. Therefore, the scope of the present disclosure is to be limited only by the appended claims.

Referring to FIG. 1, a patterned substrate 110 is provided.

In some embodiments, the patterned substrate 110 may be, for example, a silicon substrate, a gallium arsenide substrate, a silicon germanium substrate, a silicon substrate on insulator (SOI) substrate or the like. In some embodiments, the patterned substrate 110 includes a raw region 111 and a source/drain region 112 over the raw region 111, in which a trench 113 extends from the source/drain region 112 to the raw region 111 and a sidewall 114 surrounds the trench 113. In some embodiments, the patterned substrate 110 is formed by patterning a raw substrate to form the trench 113 and then implanting impurity ions to the raw substrate at neighboring sides of the trench 113 to form the source/drain region 112 over the raw region 111 and allow the conductive layer further to be disposed in the trench 113 for serving as word lines. In some other embodiments, the patterned substrate 110 is raw substrate processed by patterning. That is, the patterned substrate 110 has the trench 113, but does not have the source/drain region 112. For example, the source/drain region 112 may be formed after the step of FIG. 9.

Figure 2:
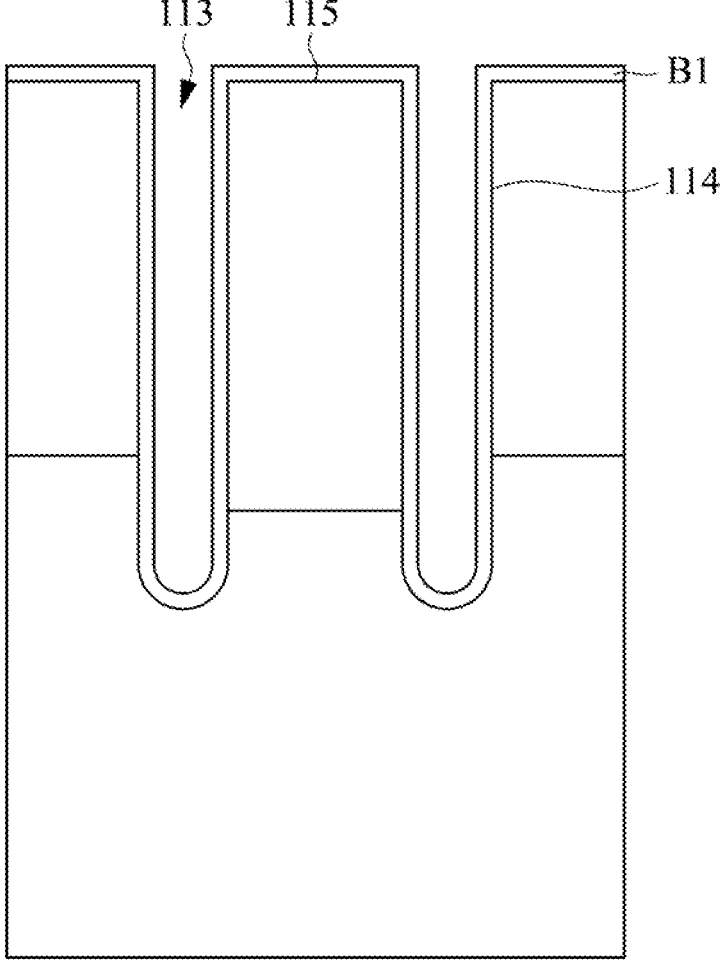

Referring to FIG. 2, the first barrier material B1 is disposed on the patterned substrate 110.

In some embodiments, the first barrier material B1 is disposed on a top surface 115 of the patterned substrate 110 and the sidewall 114 of the patterned substrate 110. In some embodiments, the first barrier material B1 comprises oxides with a permittivity higher than 3.9, such as 3.9, 4.0, 4.5, 5.0, 5.5, 6.0, 6.5, 7.0, 7.5, 8.0, 8.5, 9.0, 9.5, 10.0, or a value within any interval defined by the above-mentioned values. In some embodiments, the first barrier material B1 may be conformally formed on the patterned substrate 110 by suitable method such as chemical vapor deposition (CVD), physical vapor deposition (PVD), or the like.

Figure 3:
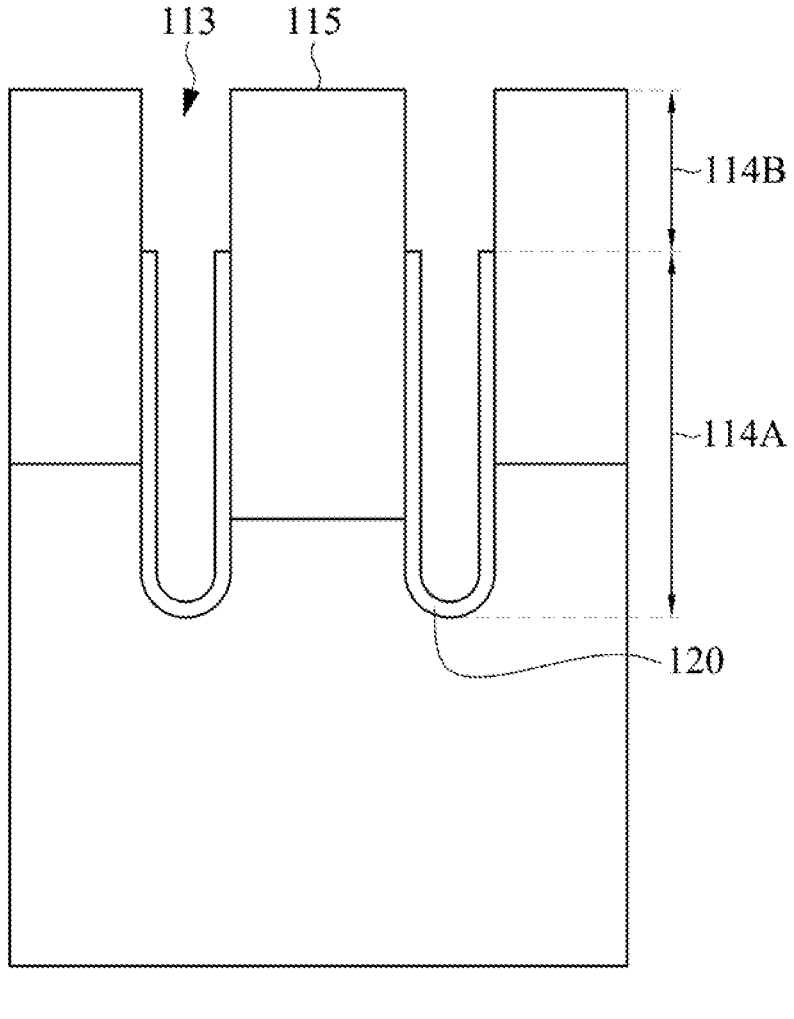

Referring to FIG. 2 and FIG. 3, the first barrier material B1 on the top surface 115 of the patterned substrate 110 is removed, and a first barrier layer 120 is formed.

In some embodiments, the sidewall 114 includes the first portion 114A and the second portion 114B, in which the second portion 114B is higher than the first portion 114A in the cross-section and neighboring to the top surface 115 of the patterned substrate 110. That is, the second portion 114B is located between the first portion 114A and the top surface 115 of the patterned substrate 110 and directly contacts with the first portion 114A. In some embodiments, the first barrier material B1 on the top surface 115 of the patterned substrate 110 and the second portion 114B are removed with a wet etchant or a dry etchant. In some embodiments, the first barrier layer 120 is directly disposed on the first portion 114A and performs a profile with an U-shaped cross-section in the trench 113. Therefore, the first barrier layer 120 can leave a recess for disposing a conductive layer (e.g., word lines) buried in the trench 113 and serving as a barrier between the patterned substrate 110 and the conductive layer to be disposed.

Figure 4:
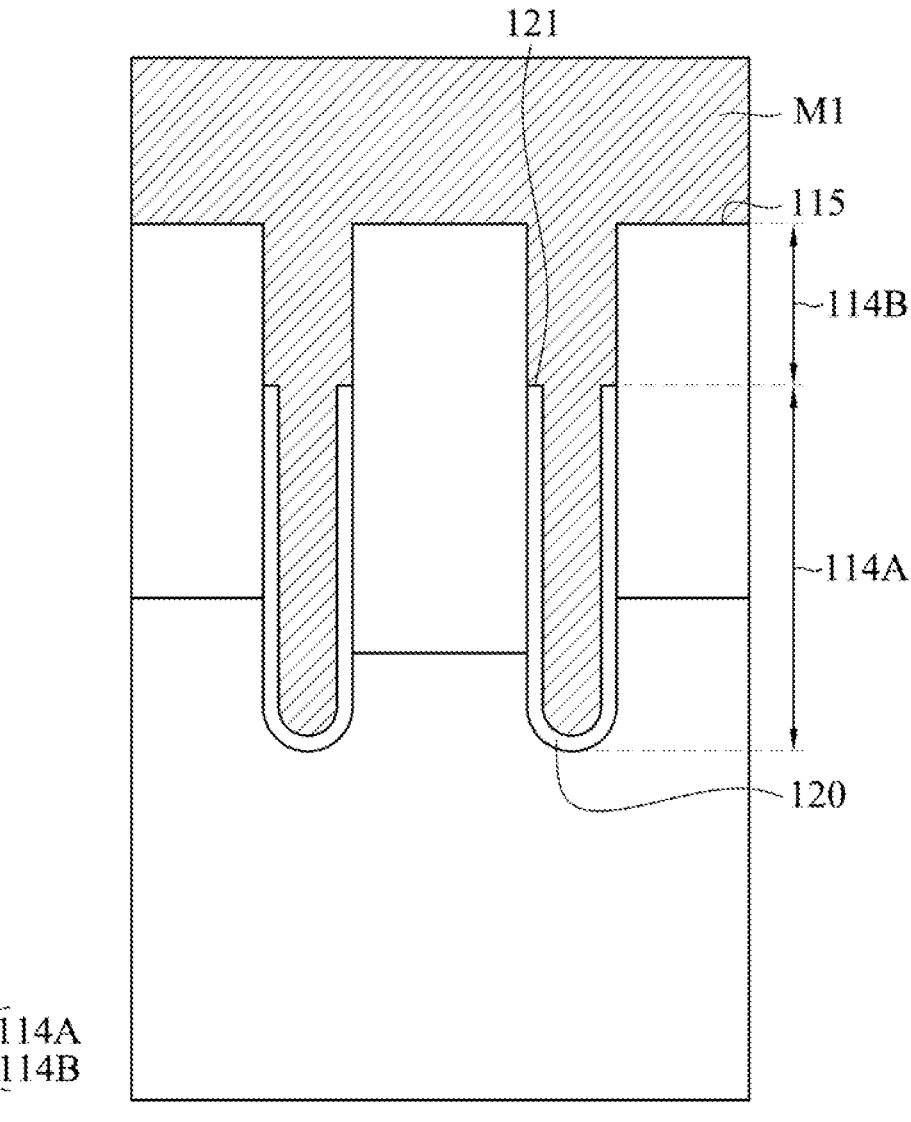

Referring to FIG. 3 and FIG. 4, the trench 113 is filled up with the first conductive material M1.

In some embodiments, the first conductive material M1 is disposed on the top surface 115 of the patterned substrate 110 and the sidewall 114, and filling the entire trench 113. In some embodiments, the first conductive material M1 includes tungsten (W), aluminum (Al), cupper (Cu), molybdenum (Mo), titanium (Ti), tantalum (Ta), ruthenium (Ru), or a combination thereof, but is not limited thereto. In some embodiments, the first conductive material M1 may be formed by suitable deposition method such as CVD, but is not limited thereto.

Figure 5:
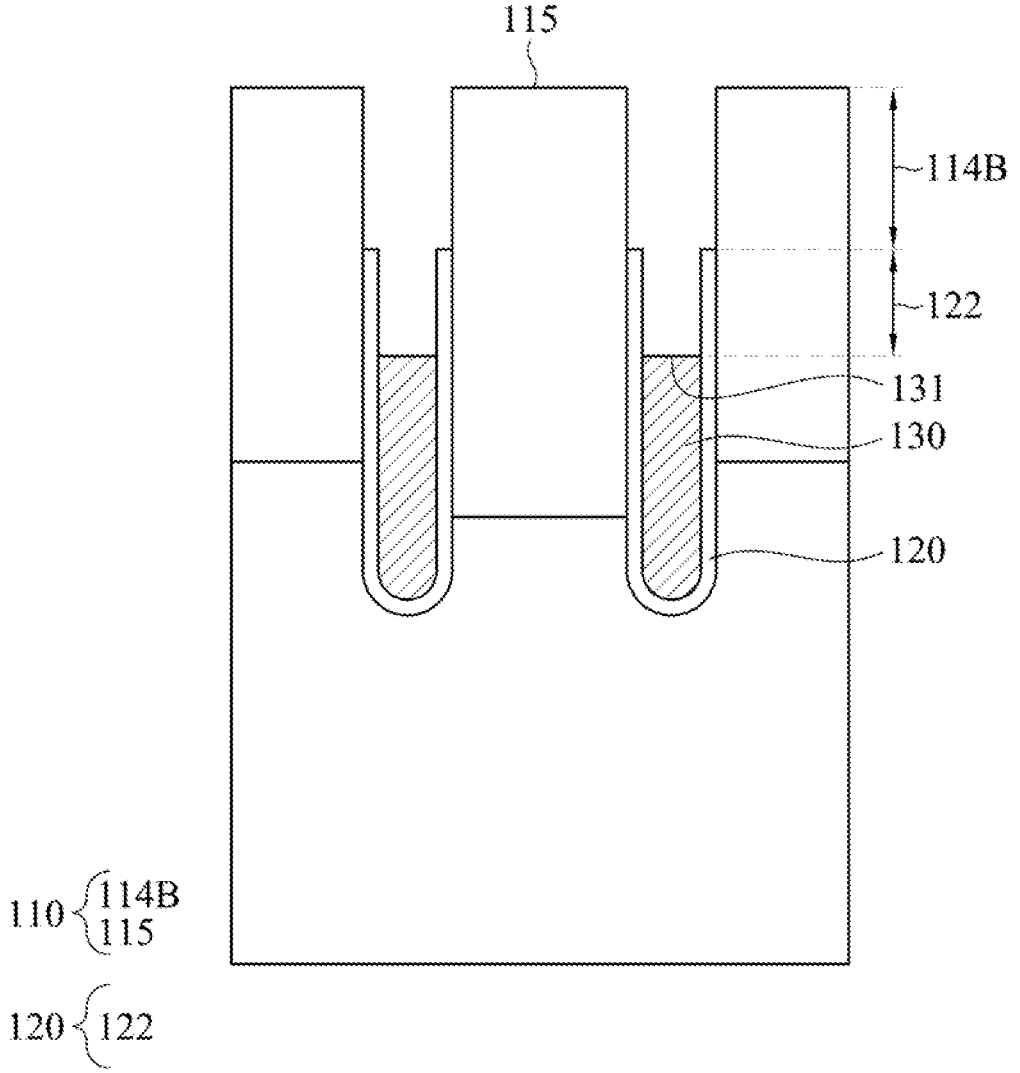

Referring to FIG. 4 and FIG. 5, the first conductive material M1 is removed, and a conductive portion 130 is formed.

In some embodiments, the first conductive material M1 on the top surface 115 of the patterned substrate 110 and on the second portion 114B is removed. In some embodiments, the first conductive material M1 is removed with a wet etchant or a dry etchant.

In some embodiments, a top surface of the first conductive material M1 is removed to be lower than the top surface 121 of the first barrier layer 120. That is, a top surface 131 of the conductive portion 130 is lower than the top surface 121 of the first barrier layer 120 for leaving a space for the further covering of the second barrier layer (as shown in FIG. 6).

Figure 6:
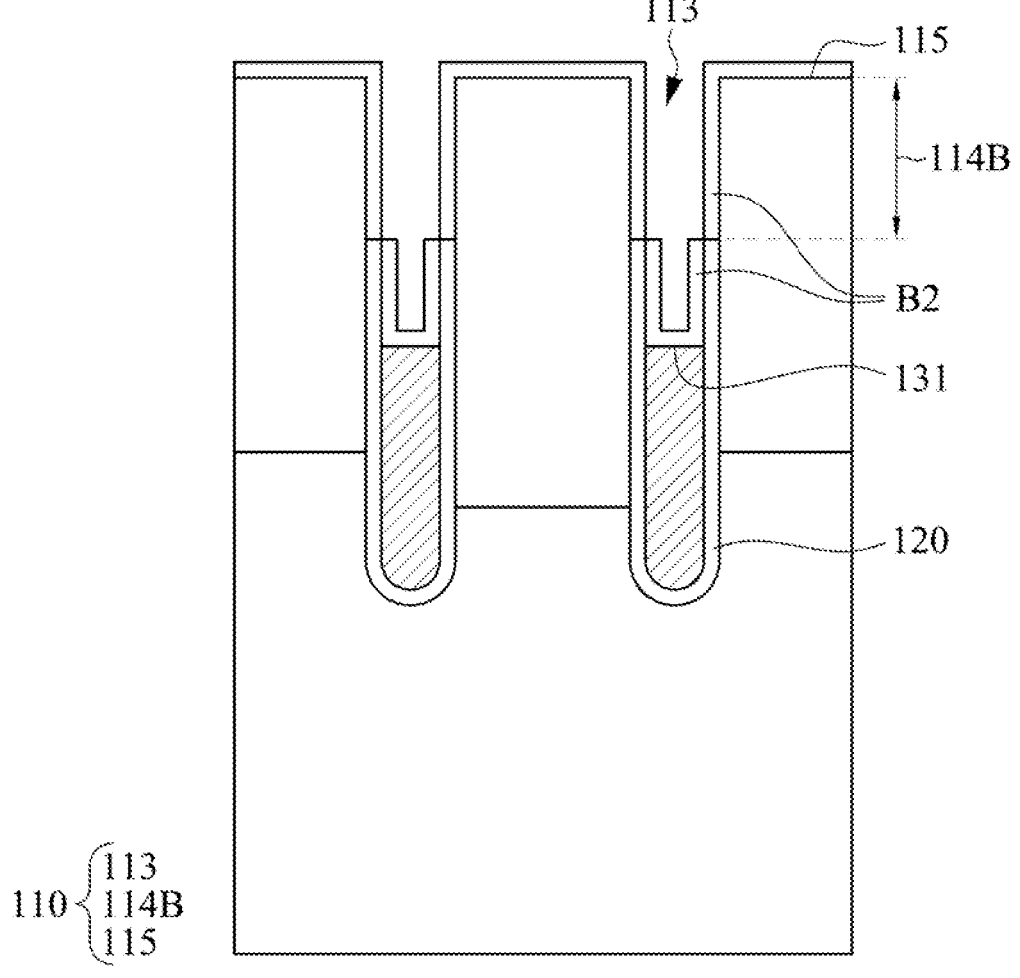

Referring to FIG. 6, the second barrier material B2 with a permittivity from 0.5 to 3.8 is disposed on the top surface 115 of the patterned substrate 110, the second portion 114B, the first barrier layer 120 and the top surface 131 of the conductive portion 130.

In some embodiments, the permittivity of the second barrier material B2 is 0.5, 1, 1.5, 2, 2.5, 3.0, 3.5, 3.8, or a value within any interval defined by the above-mentioned values, and the permittivity of the first barrier material B1 (referring to FIG. 2) is higher than the permittivity of the second barrier material B2. In some embodiments, the second barrier material B2 may be substantially and conformally formed on the top surface 115 of the patterned substrate 110, the second portion 114B of the sidewall 114, the first barrier layer 120 and the top surface 131 of the conductive portion 130 by suitable method such as CVD, PVD, or the like. In some embodiments, the second barrier material B2 covers the entire second portion 114B, the exposed portion 122 of the first barrier layer 120 and the entire top surface 131 of the conductive portion 130 (FIG. 5). For example, the second barrier material B2 covers the first barrier layer 120, and the first barrier layer 120 is not exposed. Therefore, the second barrier material B2 on the first barrier layer 120 and the top surface 131 of the conductive portion 130 performs a profile with an U-shaped cross-section in the trench 113, and leaves a space for the further disposition of the buried conductive portion.

Figure 7A:
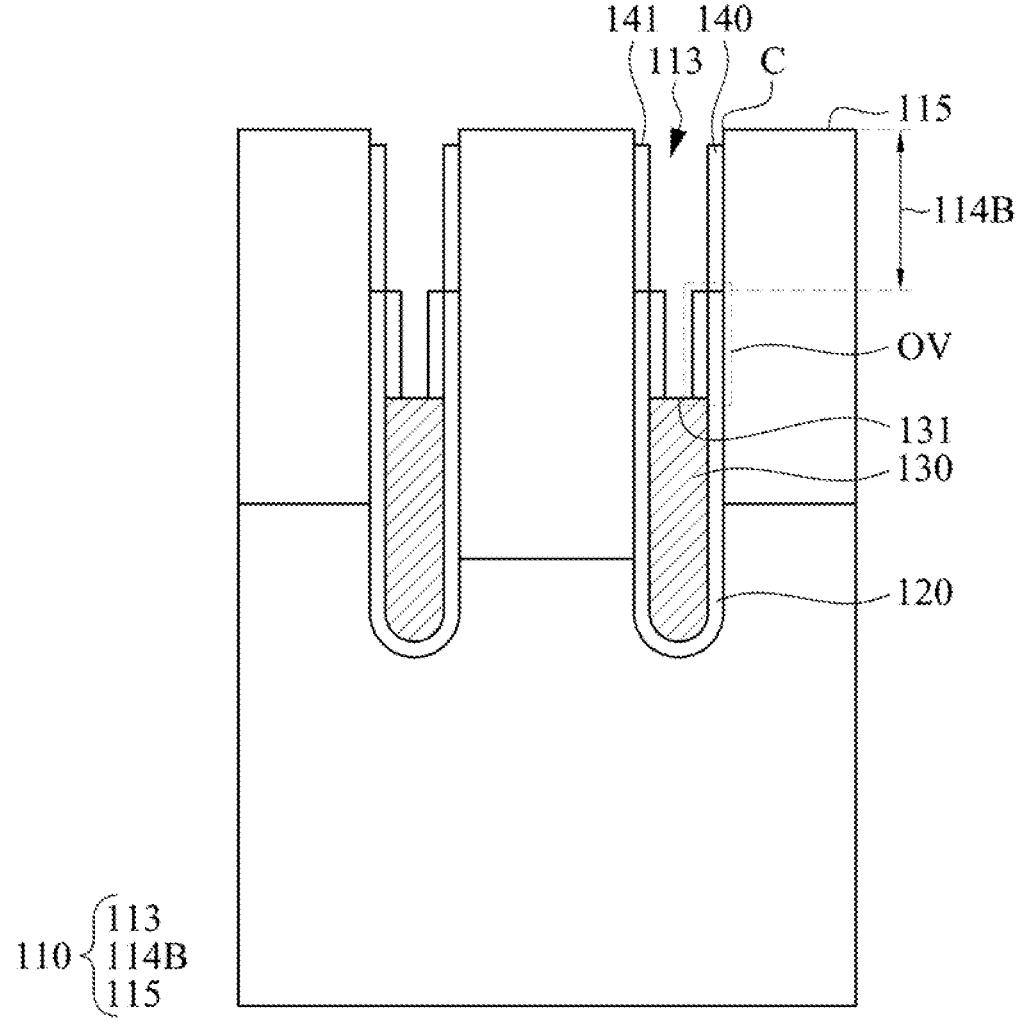

Referring to FIG. 6 and FIG. 7A, the second barrier material B2 on the top surface 115 of the patterned substrate 110 and the top surface 131 of the conductive portion 130 is removed to form the second barrier layer 140, and the conductive portion 130 is exposed.

In some embodiments, the second barrier material B2 is removed by an anisotropic etching. For example, the second barrier material B2 is removed with a dry etchant including $CF_4$, $C_2F_6$, $C_3F_8$, $C_4F_8$, $F_2$, $NF_3$, $SF_6$, $CHF_3$, HF, $COF_2$, $ClF_3$, $H_2O_2$, or a combination thereof. Therefore, only the second barrier material B2 on the entire top surface 115 of the patterned substrate 110 and on a portion of the top surface 131 of the conductive portion 130 and a little portion of second barrier material B2 on the second portion 114B neighboring to the corner C are removed, but the second barrier material B2 on the second portion 114B and the first barrier layer 120 is approximately remained. Therefore, the second barrier layer 140 further extends the area of the barrier layer and reduces GIDL between the patterned substrate 110 and conductive portion 130.

In some embodiments, the second barrier layer 140 is directly disposed on the exposed portion 122 of the first barrier layer 120 and the second portion 114B. In some embodiments, a top surface 141 of the second barrier layer 140 is lower than the top surface 115 of the patterned substrate 110. In some embodiments, the first barrier layer 120 and the second barrier layer 140 forms an overlapping region OV, in which the overlapping region OV directly contacts with the conductive portion 130 and is located between the second barrier layer 140 on the second portion 114B and the conductive portion 130. Therefore, the overlapping region OV can reduce the leakage current leaked from a corner of the first barrier layer 120.

Figure 7B:
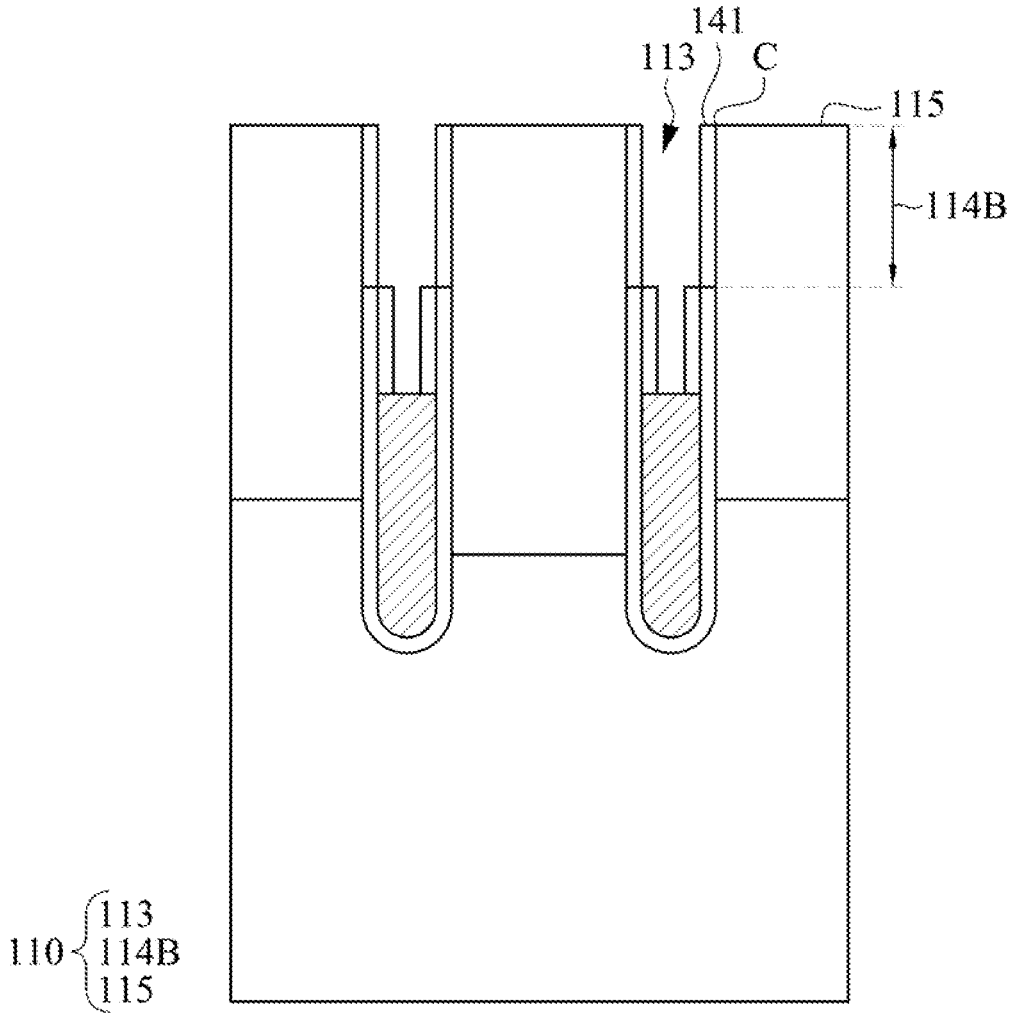
FIG. 7B is a cross-sectional view of one intermediary stage in the manufacturing of a semiconductor device in accordance with some other embodiments of this disclosure.

In some other embodiments, referring to FIG. 6 and FIG. 7B, the second barrier material B2 on the second portion 114B neighboring to the corner C remains intact, and the second barrier material B2 on the entire second portion 114B may be remained according to the practical requirements.

Therefore, the top surface 141 of the second barrier layer 140 is substantially coplanar with the top surface 115 of the patterned substrate 110.

Figure 8:
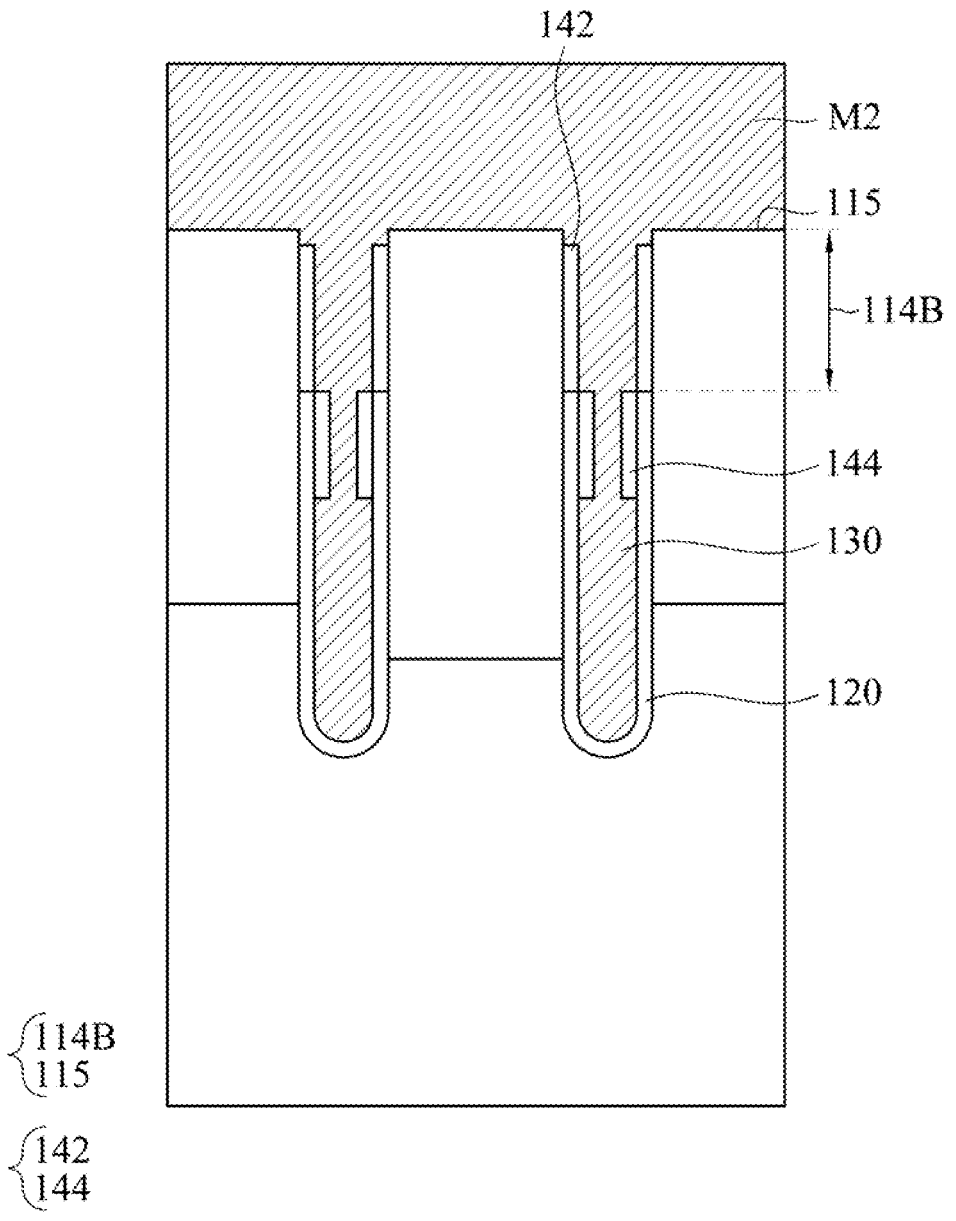

Referring to FIG. 7A and FIG. 8, the trench 113 is filled up with the second conductive material M2.

In some embodiments, the second conductive material M2 is disposed on the top surface 115 of the patterned substrate 110, the second portion 114B, the second barrier layer 140 and the conductive portion 130 and fills the entire trench 113. In some embodiments, the second conductive material M2 includes W, Al, Cu, Mo, Ti, Ta, Ru, or a combination thereof, but is not limited thereto. In some embodiments, referring to FIG. 4 and FIG. 8, the second conductive material M2 is the same as or similar to the first conductive material M1 (or referred to as the conductive portion 130) and may be formed by suitable deposition method similar to the first conductive material M1 such as CVD, but is not limited thereto. In some other embodiments, the second conductive material M2 is different from the first conductive material M1.

Figure 9:
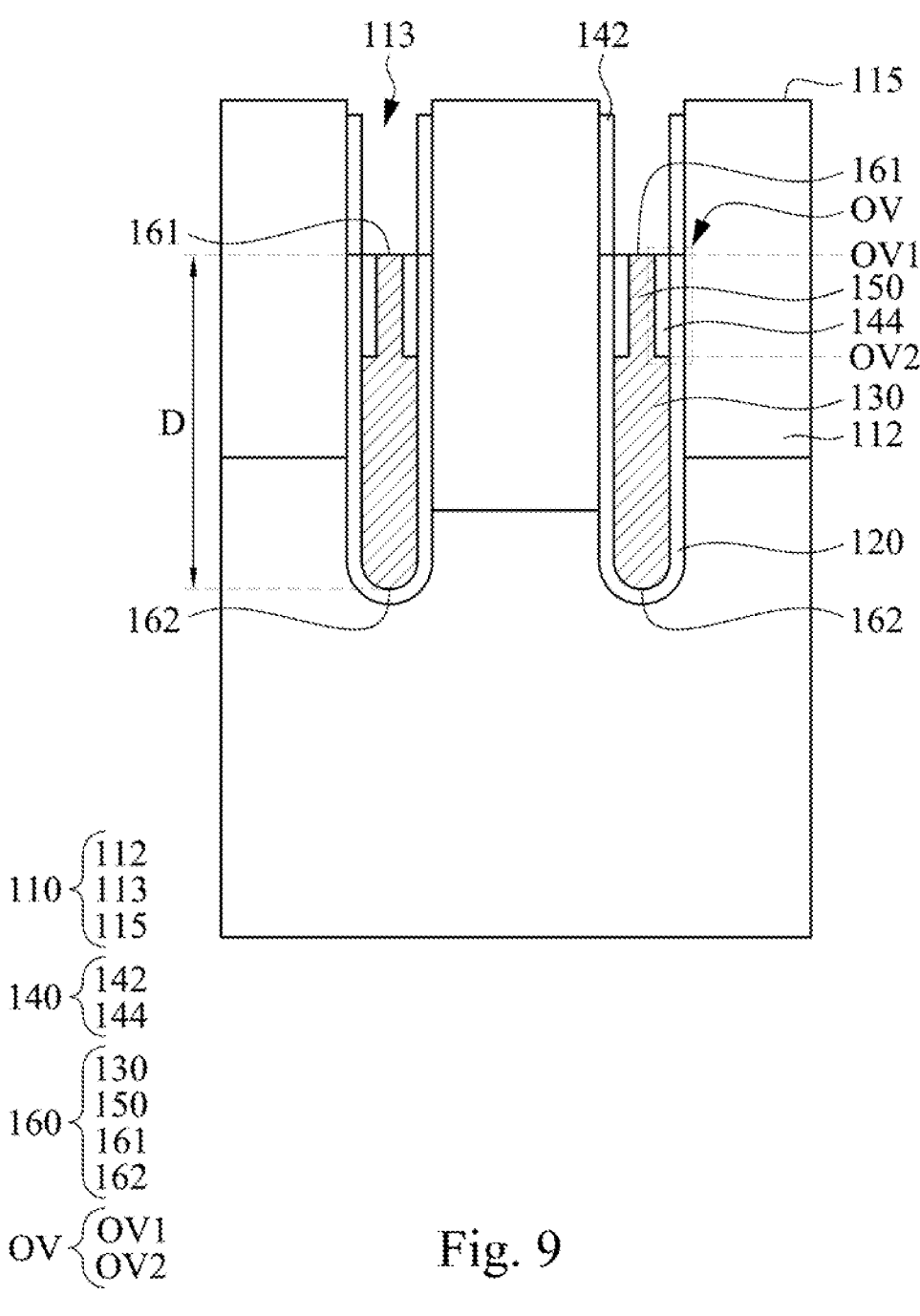

Referring to FIG. 8 and FIG. 9, the second conductive material M2 is removed, and the conductive layer 160, thereby providing a semiconductor device 100.

In some embodiments, the second conductive material M2 on the top surface 115 of the patterned substrate 110, on the second portion 114B and on a first portion 142 of second barrier layer 140 (i.e., the second barrier layer 140 directly disposed on the sidewall 114) is removed, and the second conductive material M2 directly disposed on both of the overlapping region OV and the conductive portion 130 is remained to form the conductive portion 150. In other words, the conductive portion 130 directly contacts with the conductive portion 150, and the conductive portion 130 and the conductive portion 150 forms the conductive layer 160 together. In some embodiments, the second conductive material M2 is removed with a wet etchant or a dry etchant.

In some embodiments, a top surface of the second conductive material M2 is substantially coplanar with a top surface OV1 of the overlapping region OV. That is, the top surface 161 of the conductive layer 160 is substantially coplanar with the top surface OV1 and higher than a lower surface OV2 of the overlapping region OV. The lower surface OV2 is substantially coplanar with the lower surface of the second portion 144 of the second barrier layer 140, in which the second portion 144 is the portion of the second barrier layer 140 which directly contacts with both of the conductive portion 130 and the first barrier layer 120. In some embodiments, the conductive layer 160 is disposed on the first barrier layer 120 and the overlapping region OV and partially fills the trench 113.

It is noted that the second barrier layer 140 has lower permittivity than the first barrier layer 120 and can further extend the area of the barrier layer (including the first barrier layer 120 and the second barrier layer 140). Therefore, the disposition of the second barrier layer 140 with lower permittivity can reduce GIDL caused by the overlapping of the source/drain region 112 and the conductive layer 160, compared with the semiconductor device without the second barrier layer 140.

In some other embodiments, the top surface 161 of the conductive layer 160 may be lower or higher than the top surface OV1 of the overlapping region OV (not shown in figures).

As the depth D (the depth from the top surface 161 of the conductive layer 160 to the lower surface 162) decreases, GIDL may decrease but the resistance of the conductive layer 160 may increase, and vice versa, in which GIDL and the higher resistance of the conductive layer 160 are not desired in the semiconductor device 100. It should be emphasized that the conductive layer 160 with the top surface 161 of the conductive layer 160 coplanar with the top surface OV1 of the overlapping region OV achieves the better balance to achieve GIDL reduction and low resistance comparing with which with the top surface 161 of the conductive layer 160 lower or higher than the top surface OV1 of the overlapping region OV. Comparatively, GIDL increases as the top surface 161 is higher than the top surface OV1 of the overlapping region OV, and the resistance increases as the top surface 161 lower than the top surface OV1 of the overlapping region OV.

Figure 10:
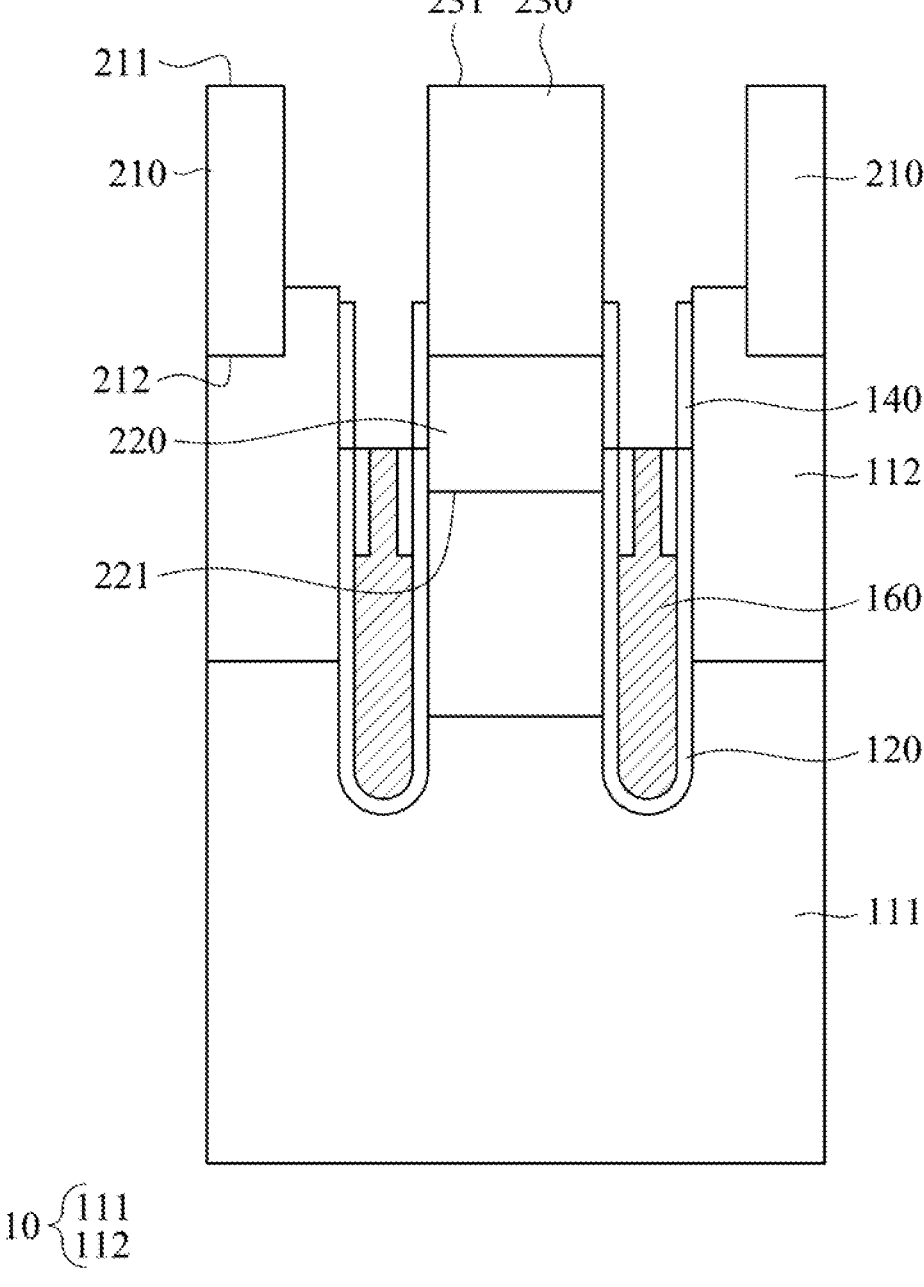

Referring to FIG. 9 and FIG. 10, a top portion of patterned substrate 110 is removed, and a first contact 210 and a second contact 220 are disposed on the patterned substrate 110.

In some embodiments, the neighboring first contacts 210 are spaced apart by the second contact 220, and a lower surface 212 of the first contact 210 is higher than a lower surface 221 of the second contact 220. That is, the second contact 220 is served as the buried contact. In some embodiments, the first contact 210 is spaced apart from the second contact 220 by the conductive layer 130. In some embodiments, a nitride layer 230 (e.g., a bit line) is disposed on the second contact 220 and directly contacts with the first barrier layer 120 and the second barrier layer 140. In some embodiments, a top surface 231 of the nitride layer 230 is coplanar with a top surface 211 of the first contact 210.

Some embodiments of the present disclosure provide a semiconductor device including the second barrier layer with the permittivity from 0.5 to 3.8. With the suppressed permittivity and the disposition of the second barrier layer, GIDL can be reduced and the electric property of the semiconductor device can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A semiconductor device comprising:
   a patterned substrate having a trench and a sidewall surrounding the trench;
   a first barrier layer disposed on a first portion of the sidewall;
   a second barrier layer disposed on the first barrier layer and a second portion of the sidewall, wherein the second portion of the sidewall is higher than the first portion of the sidewall and neighboring to a top surface of the patterned substrate, wherein a permittivity of the first barrier layer is higher than a permittivity of the second barrier layer; and
   a conductive layer filling the trench, wherein the conductive layer is disposed on the first barrier layer and an overlapping region of the first barrier layer and the second barrier layer, and the second barrier layer of the overlapping region is embedded in the conductive layer and between the conductive layer and the first barrier layer of the overlapping region.

2. The semiconductor device of claim 1, wherein the patterned substrate comprises a raw region and a source/drain region over the raw region, wherein the trench extends from the source/drain region to the raw region.

3. The semiconductor device of claim 1, wherein the first barrier layer is directly disposed on the first portion of the sidewall.

4. The semiconductor device of claim 1, wherein the first barrier layer comprises a profile with an U-shaped cross-section in the trench.

5. The semiconductor device of claim 1, wherein the second barrier layer is directly disposed on the second portion of the sidewall.

6. The semiconductor device of claim 1, wherein a top surface of the second barrier layer is coplanar with or lower than the top surface of the patterned substrate.

7. The semiconductor device of claim 1, wherein a top surface of the conductive layer is coplanar with or lower than a top surface of the overlapping region.

8. The semiconductor device of claim 1, wherein a top surface of the conductive layer is higher than a lower surface of the overlapping region.

9. The semiconductor device of claim 1, further comprising a first contact and a second contact disposed on the patterned substrate, wherein a lower surface of the first contact is higher than a lower surface of the second contact.

10. The semiconductor device of claim 9, wherein the second contact directly contacts with the first barrier layer and the second barrier layer.

* * * * *